United States Patent [19]

Schwartz

[11] 4,127,876

[45] Nov. 28, 1978

[54] VIEWER ADAPTABLE REMOTE CONTROL APPARATUS FOR TV RECEIVER

[75] Inventor: Jack Schwartz, Niles, Ill.

[73] Assignee: Admiral Corporation, Schaumburg, Ill.

[21] Appl. No.: 766,587

[22] Filed: Feb. 8, 1977

[51] Int. Cl.² .............................................. H04N 5/44
[52] U.S. Cl. .................................... 358/194; 358/254
[58] Field of Search ................. 358/194, 254; 250/199

[56] References Cited

U.S. PATENT DOCUMENTS 3,272,920   9/1966   Meurer ................................. 358/254

FOREIGN PATENT DOCUMENTS 551,321   11/1956   Italy ........................................ 358/194

OTHER PUBLICATIONS

"Star," Radio-Electronics, 12-74, pp. 44-46, 51, and 88, by Larry Steckler.

Primary Examiner—Richard Murray
Attorney, Agent, or Firm—R. Lewis Gable; Albert G. Marriott

[57] ABSTRACT

Remote control apparatus is disclosed for a television receiver, including controls for turning on and off the television receiver, selecting a channel and for adjusting the volume of the audio portion of the transmitted program. In particular, the television receiver has a housing including a front faceplate having an opening therein, wherein a remote adaptor is inserted to make electrical connection with the TV receiver, and in particular its tuner, whereby a remote transmitter may transmit, as by ultrasonic waves, signals indicative of the desired control function to be effected upon the television receiver. The operations for adapting the television receiver for remote control are carried out without tools and may be readily effected by the viewer.

15 Claims, 4 Drawing Figures

VIEWER ADAPTABLE REMOTE CONTROL APPARATUS FOR TV RECEIVER

CROSS-REFERENCE TO RELATED APPLICATION

Reference is made to the copending application Ser. No. 689,660, entitled "Selectively Coupled Synthesizer for Tuner of TV Receiver," filed May 25, 1976 in the name of D. W. Rhee, and assigned to the assignee of this invention, such application being specifically incorporated herein by reference.

BACKGROUND OF THE INVENTION

1. Field of the Invention

The present invention relates to television receivers and in particular to means or circuits for adapting a television receiver for remote control.

2. Description of the Prior Art

It is well-known in the prior art to provide a remote control unit or apparatus for a television (TV) receiver, whereby signals may be transmitted from a point remote of the television receiver, typically by ultrasonic waves to the television receiver, to change the channel or to vary the volume of the audio program, as well as to turn on or off the TV receiver. Typically, such remote control apparatus includes a transducer or speaker capable of emitting ultrasonic waves which are directed toward the television receiver and are picked up by a microphone or transducer responsive to such ultrasonic waves, such ultrasonic waves then being converted into electrical signals capable of modifying the aforenamed functions within the TV receiver. Typically in the prior art, the microphone or transducer is permanently built into the TV receiver, along with the necessary amplification circuitry for amplifying and adapting the output of the receiver's microphone or transducer to permit the electrical signal to be of an appropriate form to be applied to the various portions of the TV chassis, e.g. UHF-VHF tuner, the audio amplifier, etc.

Typically, if it were desired to provide a TV receiver capable of remote control, it was necessary to permanently incorporate the microphone or transducer, as well as the adapting amplifier, within the TV receiver. Alternatively, if it were desired to market a TV receiver capable of being adapted for remote control at a later time, it was typically necessary in the prior art to require a rather complicated, extensive modification of the television receiver, as by a television technician. Typically, such adaptation of a television receiver to permit remote control, is beyond the normal capability of the average viewer. Thus, the present invention is particularly directed toward providing a television receiver that is readily adapted, by the average viewer without the use of any tools, to modify the set as by the insertion of an adaptor that will permit the remote control of the television receiver.

The above-identified application entitled "Selectively Coupled Synthesizer for Tuner of TV Receiver," describes a television receiver, and in particular a tuner of the varactor type, capable of being adapted for remote control. In particular, the above-described tuner includes a synthesizer selectively coupled during an initial period of operation to apply a tuning voltage to a varactor-type tuning circuit, and thereafter, the tuning voltage as developed by an automatic fine-tuning (AFT) circuit is applied to the tuner. The synthesizer circuit, as described in the above-identified application, comprises a keyboard, upon which the desired channel is selected to be stored within a channel memory. The output of the channel memory controls a programmable divider to divide the output of the tuner's local oscillator by a factor in accordance with the selected channel. The output of the programmable divider is phase-compared or mixed with the output of a reference oscillator, which is divided down by a fixed factor, to provide the desired tuning voltage. To select a particular channel, the synthesizer is actuated selectively for a relatively short period, during the initial period of operation, to develop the tuning voltage in accordance with the desired channel. Once the tuner has been tuned and such a desired channel has been selected, the AFT circuit is coupled to place a corresponding tuning voltage upon the tuner. Selectively-actuated switch means is responsive to energize the synthesizer circuit or the AFT circuit to operatively connect either of the foregoing circuits to the tuning circuit. The TV receiver as described in the above-identified application is readily adapted for remote control, as will be explained in accordance with the subject invention, whereby a channel is selected remotely and such information is carried by ultrasonic waves to the TV receiver, the signal being received by a transducer and decoded by a circuit within the tuner of the subject application, whereby the signal indicative of the desired channel is stored in the aforementioned memory.

In the adaptation of the receiver and in particular of the tuner as described in the subject application, it is necessary to ensure that the adaptation is relatively simple, whereby the average viewer may readily perform the adapting operation without the use of any tools. To this end, it is necessary that the number of electrical interconnections be simplified and that the power requirements to be applied to the remote control adaptor be relatively low to avoid possible shock hazards.

SUMMARY OF THE INVENTION

It is therefore an object of this invention to provide a TV receiver that may be adapted readily by an average viewer to permit remote control of the television receiver.

It is a further object of this invention to permit the adaptation of a TV receiver for remote control without the use of any tools and in a manner to avoid a shock hazard to the viewer who is performing the modifying operation.

It is a still further object of this invention to provide a television receiver, without the adapting circuitry for remote being permanently in, but adapted for modification in a relatively simple manner.

In accordance with these and other objects, the present invention provides a TV receiver that is capable of simplified modification to permit remote control. In particular, the TV receiver includes a housing having an opening within the front face thereof to permit the facile insertion of a remote adapter therein and a plate covering the opening when the TV receiver is not adapted for remote control. The remote adaptor illustratively includes a microphone or transducer for receiving ultrasonic waves from a remote control unit and an amplifier capable of amplifying and adapting the output of such transducer to provide signals to a decoding circuit within the television receiver to permit signals indicative of various functions of the television receiver operation. For example, such signals would be capable of changing the TV receiver's channel and volume, and of turning on and off the TV receiver.

In an illustrative embodiment of this invention, the remote control unit includes a plurality of push-buttons to permit the digital selection of the desired channel, to increase or decrease the volume of the audio output, and to turn on and off the TV receiver. Such buttons are connected to a transmitter encoder capable of providing a signal whose frequency is dependent upon the desired function, such encoder output being amplified and applied to an ultrasonic transducer or loudspeaker for generating the ultrasonic waves by which the function control signal is transmitted to the remote adaptor.

BRIEF DESCRIPTION OF THE DRAWINGS

These and other objects and advantages of the present invention will become more apparent by referring to the following detailed description and accompanying drawings, in which.

DETAILED DESCRIPTION OF A PREFERRED EMBODIMENT

Figure 1:
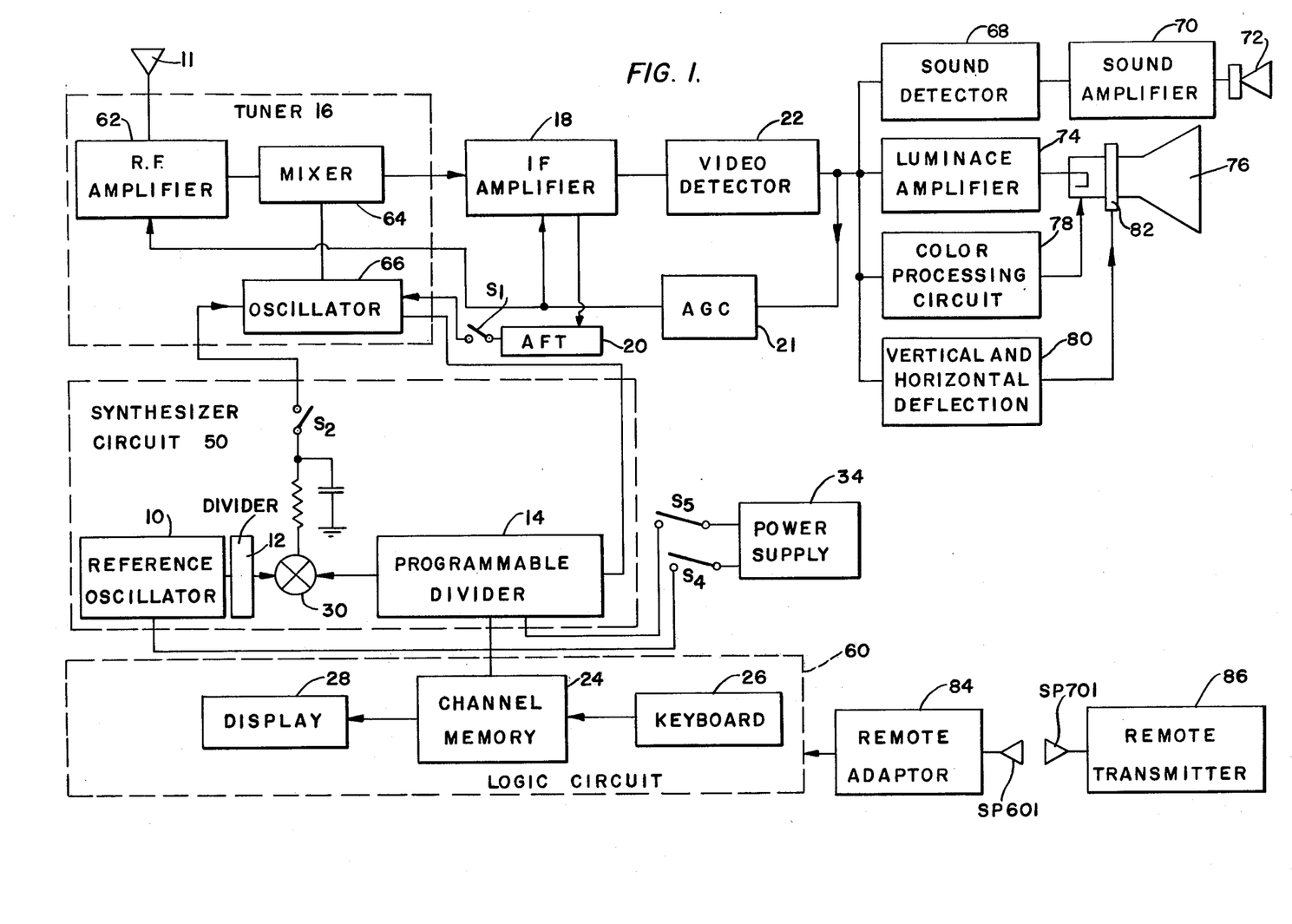
FIG. 1 shows a block diagram of a TV receiver, capable of being adapted in accordance with the teachings of this invention to receive a remote adaptor.

With reference to the drawings and in particular to FIG. 1, there is shown a color television (TV) receiver into which a synthesizer circuit 50 and a logic circuit 60 have been incorporated. The color television receiver includes an antenna 11 coupled to a tuner 16, and in particular to an RF amplifier 62 thereof for amplifying the received signal to be applied to one input of a mixer 64 to be mixed with the output of a local oscillator 66. In turn, the output of the tuner 16 and in particular its mixer 64, is applied to an IF amplifier 18, and thereafter to a video detector 22. The video detector output is applied to a conventional automatic gain control (AGC) circuit 21, whose output is applied to the IF amplifier 18 and to the tuner 16. The output of the video detector 22 is applied also to a luminance amplifier 74, the output of which controls a representation of monochrome or brightness information as applied to the cathode element of a cathode ray tube (CRT) 76. Further, the output of the video detector 22 also is applied to a vertical and horizontal deflection circuit 80 whereby suitable vertical and horizontal deflection signals are applied to a yoke 82 disposed about the envelope of a cathode ray tube 76. In addition, the video detector output is applied to a sound channel comprised of a sound detector 68, whose output is amplified by a sound amplifier 70 before being applied to a loudspeaker 72. Further, the output of the video detector 22 is applied to a color processing circuit 78, whereby the appropriate red, green and blue signals are developed and applied to the respective electron guns of the color CRT 76.

The synthesizer circuit 50 includes a reference oscillator 10 for providing a substantially constant output signal of 4 MHz, to be applied to a divider 12, which divides the oscillator output signal by a fixed factor and applies it to a phase comparator or mixer 30. A further input is applied to the phase comparator 30 from a programmable divider 14, comprised of a plurality of dividers and a read-only memory (ROM), whereby the programmable divider 14 is selectively set to provide an input signal thereto by a factor dependent upon the selected TV channel to be tuned. The particular channel to be tuned is set by a logic circuit 60 comprised of a keyboard 26, upon which the viewer selects the channel to be tuned, and whose output indicative of the channel to be tuned is applied to a channel memory 24. The memory 24 stores the selected channel, and applies its outputs to a display 28 whereby the selected channel is visually displayed and also to the programmable divider 14 to determine the factor by which the output of the oscillator 66 is divided selectively in accordance with the selected channel. The programmable divider 14 output in turn is phase-compared with the divided, reference oscillator output to provide the tuning signal, typically a DC voltage signal, of an amplitude determined in accordance with the channel to be tuned by the tuner 16. The synthesizer circuit 50 further includes a power supply 34, selectively coupled by switches S4 and S5, respectively, to the reference oscillator 10 and to the programmable divider 14. The output of the phase comparator 30 is applied selectively for an initial period of operation by a switch S2 to the VHF and UHF varactor tuner 16. In particular, the output of the phase comparator 30 is applied to the oscillator 66 of the tuner 16.

In operation, the viewer selects the desired channel to be tuned by entering an appropriate number upon the keyboard 26. At this time, a signal is developed, whereby the switches S4, S5 and S2 are effectively closed or made operative. It is understood that the switches S2, S4 and S5 are electronic switches and are actuated or closed during the initial period of operation, illustratively 300 ms. It is understood that during this initial period of operation, switch S1 remains open, whereby the tuning voltage is derived solely from the synthesizer circuit 50. During the subsequent period of operation, the switches S2, S4 and S5 are open and the switch S1 is closed, and the tuning voltage of the tuner 16 is derived from the output of the AFT circuit 20 through the closed switch S1 to the VHF and UHF varactor tuner 16.

In the initial operating period, the stored channel selection signal is applied to the programmable divider 14, which is decoded by a ROM thereof to set the factor by which the output of the oscillator 66 is divided. The programmable divider 14 is capable of dividing the oscillator output by a variable factor. The programmable divider output and the divided reference oscillator output are mixed or compared by the comparator 30 to develop the DC signal indicative of the desired channel to which the tuner 16 is to be tuned. After the initial period of operation, the switches S2, S4 and S5 are opened and the switch S1 is closed. At this time, the varactor-type tuner 16 has been tuned selectively to provide an output successively through the IF amplifier 18 and video detector 22. The output of the IF amplifier 18 also is applied to the AFT circuit 20 which develops a fine-tuning signal whereby the precise-tuned frequency of the tuner 16 is prevented from drifting. The AFT circuit 20 continues to provide during this subsequent period of operation, a DC voltage indicative of the desired channel to which the varactor-type tuner 16 is to be tuned.

Figure 2:
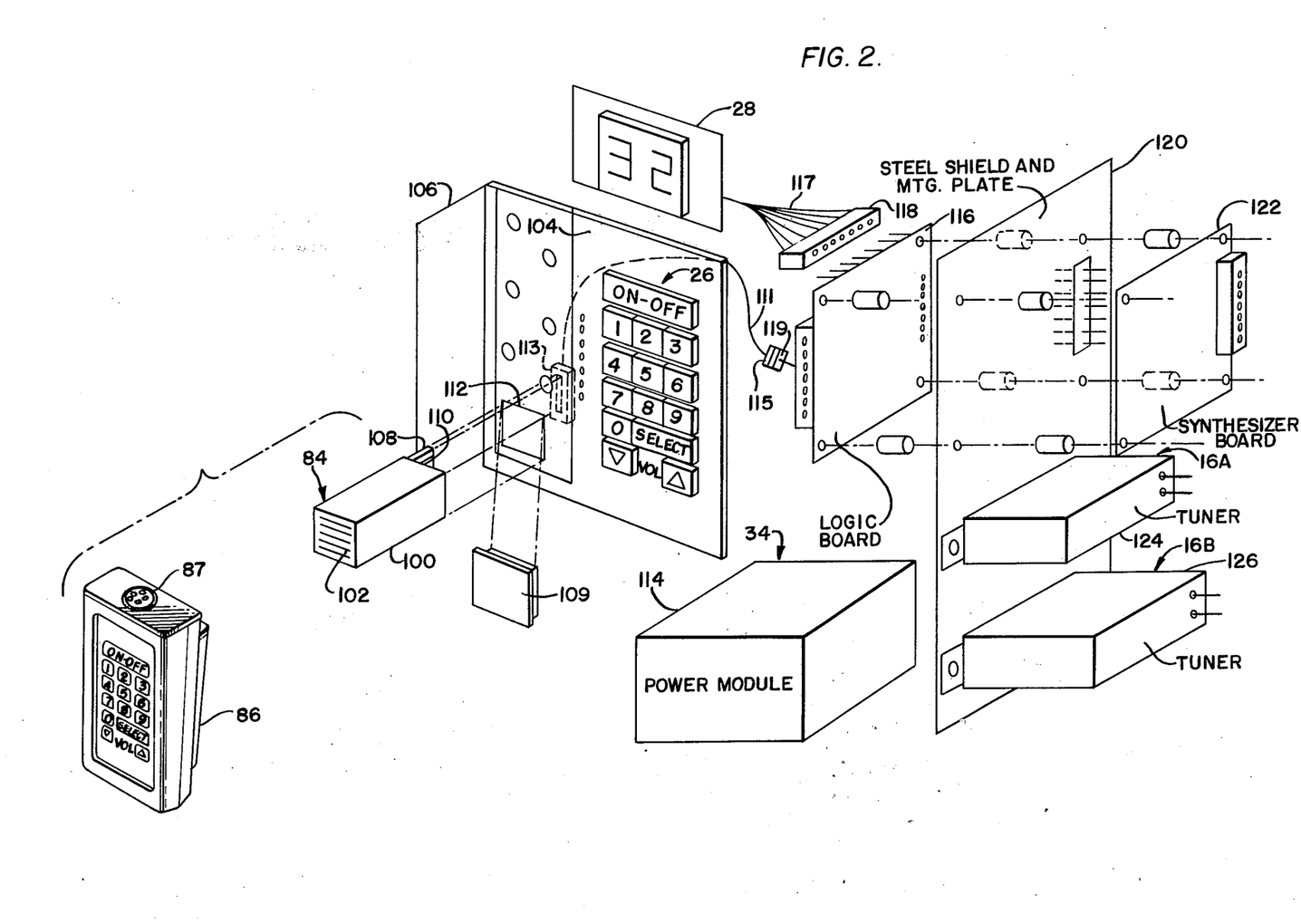
FIG. 2 is a perspective view of a portion of the television housing and chassis, showing the manner in which a remote adaptor in accordance with the teachings of this invention may be inserted in an opening within the front face of the TV's housing.

As generally shown in FIG. 1, there is provided in accordance with the teachings of this invention, a remote adaptor 84 that processes the ultrasonic signal as transmitted from a remote transmitter 86 to provide various function control signals to the TV receiver. In particular, as shown in FIGS. 1 and 2, the viewer may first actuate the buttons marked 1 to 0 of the remote transmitter 86 to select the desired channel to be viewed, and thereafter, the SELECT button to enter the selected channel. As will be explained, the remote transmitter 86 responds to the actuation of these buttons to generate through openings 87, waves which are transmitted to the remote adaptor 84, wherein the ultrasonic waves are sensed and converted, as will be explained in greater detail later, to a channel-indicating signal to be stored within the channel memory 24 of the logic circuit 60. Similarly, the volume of the signal may be similarly varied by actuating either the Δ or ∇ buttons, whereby a signal as derived from the remote adaptor 84 is applied via the logic circuit 60 to the sound detector 68 so that the volume of the sound is changed. In addition, the viewer may actuate the "ON-OFF" button of the remote transmitter 86, whereby a signal is developed by the logic circuit 60 to actuate or deactuate the power supply (not shown) for the entire TV receiver. The detailed circuitry of the remote transmitter 86, the remote adaptor 84 and its interconnection with a TV receiver, will be explained in detail below with respect to FIGS. 3 and 4.

With reference now to FIG. 2, there is shown a portion of the TV housing and chassis for receiving the circuit components as generally shown in FIG. 1. In particular, there is shown a faceplate 104 that typically would be disposed upon the front of the TV receiver, permitting ready access by the viewer. Typically, the TV receiver of this invention would be sold to the viewer without the remote adaptor 84 and the remote transmitter 86 connected thereto, and at the option of the viewer, such additional apparatus could be purchased and readily interconnected therewith in a manner now to be explained. In particular, the faceplate 104 is provided with a cover 106 pivotally mounted with respect to the faceplate 104. The cover 106 is normally closed, but is shown in FIG. 2 in its open position. With the cover 106 open, the removable cover 109 is removed to expose the opening 112 and then the remote adaptor 84 may be installed and in particular inserted within the opening 112 within the faceplate 104. The remote adaptor 86 comprises a housing 100 for receiving the various circuit elements wherein, which will be explained in detail with respect to FIG. 3, a set of openings of slits 102 through which the ultrasonic waves or sounds are transmitted thereto, and a connecting board 108 upon which various contacts 110 are provided, whereby the output of the remote adaptor 84 is supplied to selected electrical circuits of the TV receiver. Upon insertion of the remote adaptor 84, the housing 100 being of substantially the same configuration as the opening 112, the circuitboard 108 engages a female receptacle 113, whereby the contacts 110 electrically engage a corresponding set of contacts (not shown), which are connected via cable 111 and socket assemblies 115 and 119 to the logic circuit 60 mounted upon the logic circuitboard 116. Thus, the electrical signals applied by the remote adaptor 84 to the logic circuit 60 are of a relatively low voltage so that no high voltage hazard is presented to the viewer. In addition, a limited number of contacts 110 are necessary to make this connection, thereby ensuring that a relatively simple operation, i.e. the insertion of the remote adaptor 84 into the defined opening 112, is all that is required to adapt the TV receiver for remote control. The configuration of the remote adaptor 84, the opening 112 and the connector assembly 113 are such to prevent incorrect electrical connection.

In addition, the logic circuitboard 116 is mounted upon a mounting plate 120, upon which are mounted the UHF tuner 16A and the VHF tuner 16B, as contained within housings 124 and 126, respectively. Further, a synthesizer circuitboard 122 is provided for receiving the synthesizer circuit 50, as generally illustrated in FIG. 1. In addition, the selected channel is displayed upon the digital display 28, which is coupled by a cable 117 and a connector assembly 118 to the logic circuit 60 mounted upon the board 116.

Figure 3:
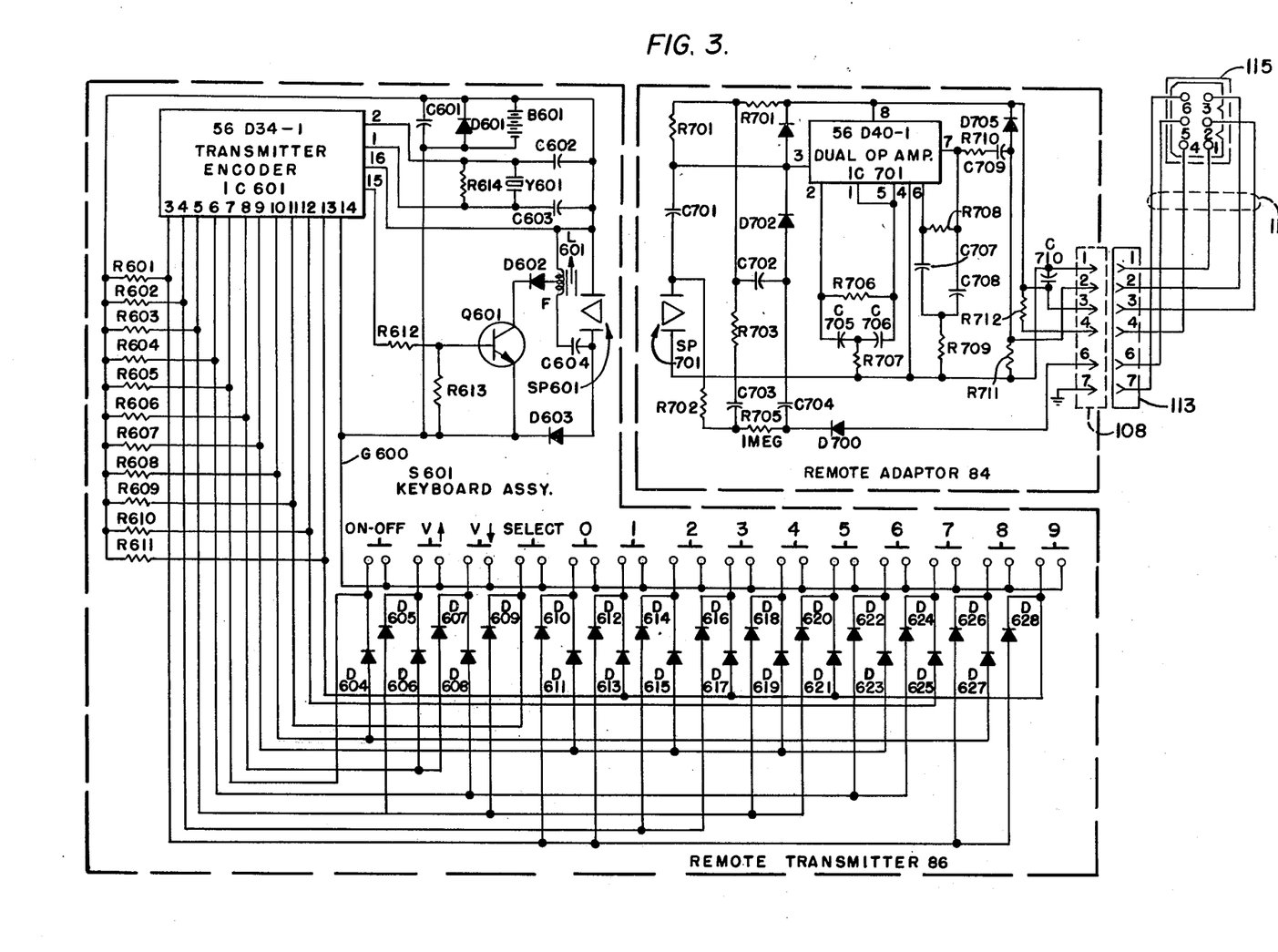
FIG. 3 is a detailed schematic drawing of the circuit elements of the remote transmitter and the remote adaptor.

Referring now to FIG. 3, there is shown the detailed circuitry of the remote adaptor 84 and the remote transmitter 86. The remote adapter 84 receives ultrasonic waves which are detected by its transducer SP701, to produce an output that is amplified and applied via the male-type connector assembly 108, the female-type connector assembly 113 and cable 111 to the socket assembly 115. The socket assembly 115 is connected to the logic circuit 60, as will be explained in greater detail with respect to FIG. 4. In an illustrative embodiment of this invention, the ultrasonic waves are chosen to be in a bandwidth of 38-43 KHz and are sensed by the transducer SP701, which applies an output in response thereto via a coupling capacitor C701 to an input terminal 3 of a dual operation amplifier IC701. The amplifier IC701 is designed particularly to selectively amplify those frequencies within the bandwidth of interest, e.g. 34-43 KHz, and to provide an output from its terminal 7 via coupling resistor R710 and capacitor C709 via pins 2 of the connector assemblies 108 and 113 to pin 2 of the socket assembly 115. A circuit comprising resistor R706, series-connected capacitors C705 and C706, and resistor R707, provide a frequency-compensating, bandwidth-shaping circuit for one of the amplifiers of IC701. In similar fashion, the circuit comprised of resistor R708, capacitors C707 and C708, and resistor R709 provide a frequency-compensating circuit for the other amplifier of IC701. An AC power signal is derived from pin 5 of the socket assembly 115 and is applied via the pins 6 of the connector assemblies 113 and 108 to the circuitry of the remote adaptor 84 and in particular to the diode D700, whereby the AC signal is rectified to provide a DC bias across a resistor R702 for the transducer SP701; in addition, the resistor R702, which is of a particularly high value, e.g. 1 MegΩ, provides isolation for the transducer SP701. The capacitors C703 and C704, and resistor R705 further filter the rectified AC signal to provide an essentially DC signal to the transducer SP701. The diodes D701 and D702 are connected to the inputs of the operational amplifier IC701 to limit or clamp the voltage that is supplied from the transducer SP701 to the operational amplifier IC701, to prevent its overloading.

With respect to FIG. 3, the remote transmitter 86 includes a keyboard assembly S601 comprised of a plurality of buttons marked ON-OFF, Δ, ∇, SELECT and 0-9. In particular, the ON-OFF button serves to turn on and off the television receiver, while the volume Δ and ∇ buttons respectively increase and decrease the volume of the sound. The buttons 0–9 permit the viewer to select any of the UHF or VHF channels by simply pushing those digits corresponding to the selected channel and thereafter activating the select button. As shown in FIG. 3, the aforementioned buttons connect selected inputs of a transmitter encoder IC601 to a ground line designated G600 via selected ones of isolation diodes D604 to D628. A resistive network comprised of resistors R601 to R611 interconnected between a power source B601 (illustratively taking the form of a 9V battery) and each of the inputs 3 to 14 of the encoder IC601, serve to appropriately bias each of the inputs 3 to 14. Further, damage to the circuit is prevented by the incorrect insertion of the battery B601 by the diode D601.

By pushing one of the aforementioned buttons, a selected number of the inputs are set to "0" or ground, while the remaining inputs remain at a high or "1" voltage, thus inputting a selected digital signal to the encoder IC601. The transmitter encoder IC601 selectively divides a reference or clock signal, as derived from an oscillator circuit comprised of crystal oscillator Y601, capacitors 602 and 603, and resistor R614, to provide via its output terminal 15 a signal of selected frequency dependent upon the command to be given to the TV receiver. In a particular illustrative embodiment of this invention, the transmitter encoder IC601 is an integrated circuit, as manufactured by ITT under their designation SAA1024, and the crystal Y601 is selected to resonate at a frequency of precisely 4.433618 MHz.

As shown in FIG. 3, the remote transmitter 84 is powered by its own power supply, i.e. battery B601, whose output is filtered by capacitor 601 to provide appropriate bias through the aforementioned resistors 601 to 611, to the inputs 3 to 14 of the encoder IC601. The output of the encoder IC601 is derived from its terminal 15 and applied via a coupling resistor R612 to provide a voltage drop across resistor R613 between the base emitter of an amplifying transistor Q601. The output as derived from the collector of transistor Q601 is applied via isolation diode 602, inductor L601 and capacitor C604 to the transducer or speaker SP601. A DC bias is provided by the diode D603 to the transducer SP601. The transducer SP601 is particularly adapted to emit ultrasonic waves in the bandwidth of 38–43 KHz.

In operation, the viewer depresses one of the buttons, ON-OFF, Δ, ∇, SELECT and 0–9, to initiate a particular function of the TV receiver. In response to the resulting digital input signal, the encoder IC601 emits a signal of a particular frequency which is amplified by transistor Q601 and converted by transducer SP601 to an ultrasonic wave, which is transmitted to the remote adaptor 84 that has been inserted within the TV receiver, as explained with respect to FIG. 2. The remote adaptor 84, and in particular its transducer SP701, converts the ultrasonic waves to an appropriate electrical signal that is amplified by operational amplifier IC701 to provide an output to pin 2 of the socket assembly 115, which is plugged into a socket assembly 119 of the logic circuit 60, as shown in FIG. 4.

Figure 4:
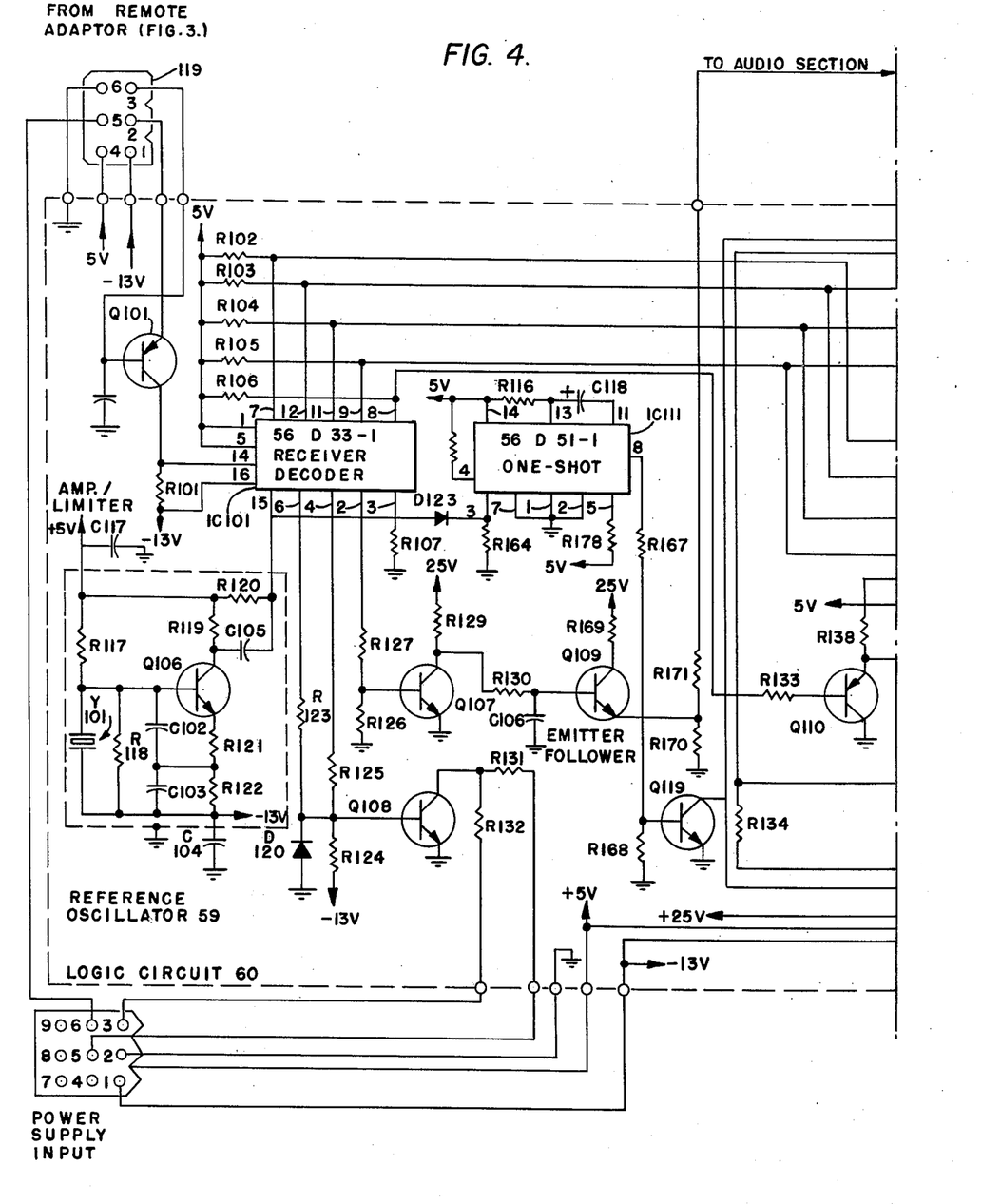
FIG. 4 is a detailed schematic of a portion of the TV receiver and in particular the logic circuit thereof, as shown generally in FIG. 1, and the manner in which the interconnection is made between the remote adaptor and the TV's tuner.

With reference now to FIG. 4, the input signal of selected frequency is applied from pin 2 of a socket assembly 119 to the emitter of an amplifying, limiting transistor Q101, whose output is applied across resistor R101 to the input terminal 14 of a receiver decoder IC101; in an illustrative embodiment of this invention, the receiver decoder IC101 takes the form of an integrated circuit manufactured by ITT under their designation SAA1025. As shown in FIG. 4, a reference oscillator 59 of the logic circuit 60 provides a reference or clock signal to an input terminal 15 of the receiver decoder IC101. Illustratively, the reference oscillator 59 includes a crystal oscillator Y101 oscillating illustratively at a defined frequency of 4.433618 MHz, the same as that frequency of the oscillator Y601 of the remote transmitter 86. The reference oscillator crystal Y101 is connected to the base of transistor Q106, whose base is connected to ground via capacitors C102 and C103 and whose emitter is connected to ground via resistors R121 and R122. The aforementioned components determine the frequency of the output signal of the oscillator 59 as derived from the collector of transistor Q106 and applied via a coupling capacitor C105 to the input terminal 15 of the receiver decoder IC101.

The receiver decoder IC101 serves to count or detect the frequency of the output of the remote adapter 84 as derived from transistor Q101 and to provide, in digital form, output signals indicative of a particular selected function of the television receiver. For example, if a particular channel has been selected, the receiver decoder IC101 detects or counts the frequency of the aforementioned input signal to derive at its output terminals 7, 12, 11, 9 and 8 a signal indicative of the selected channel, in digital form, to be applied to a set of registers, whose structure, interconnection and operation are more fully explained in the above-identified application entitled "Selectively Coupled Synthesizer for Tuner of TV Receiver." If, in accordance with the frequency of the input signal, the receiver decoder IC101 detects that the volume is to be changed, an appropriate signal is derived from its output terminal 2 to be applied via amplifying transistors Q107 and Q109 to provide an output signal for the control of the audio section of the television receiver. In similar fashion, if the receiver decoder IC101 indicates that an ON-OFF signal is desired, an output is derived from its output terminal 6 and is applied via amplifying transistor Q108 to the power supply input, whereby the power supply is turned on or off in response thereto.

Thus, there has been shown a remote control for a TV receiver, which is particularly adapted for viewer installation without the need to use any tools to rearrange the circuitry of the TV receiver or to make special connections of the remote control unit to the tuner section of the TV receiver. In this regard, there is provided a remote adapter that is supplied by the TV receiver with a relatively low voltage signal, thus reducing the shock hazard to the viewer and also eliminating the provision in all TV receivers of a receiving transducer and appropriate amplifying circuitry, regardless of whether there is a desire to utilize the remote control feature or not.

Numerous changes may be made in the above-described apparatus and the different embodiments of the invention may be made without departing from the spirit thereof; therefore, it is intended that all matter contained in the foregoing description and in the accompanying drawings shall be interpreted as illustrative and not in a limiting sense.

What is claimed is:

1. In a television receiver, a readily adaptable apparatus for providing a remote control of selected functions of said television receiver, said remote control apparatus comprising:

(a) an optional detachable remote adaptor adapted to be readily mounted within said television receiver and including a first transducer responsive to ultrasonic sounds indicative of the television function being controlled, amplifier means for amplifying the output of said first transducer and means for readily coupling the output of said amplifier means to circuitry of said television receiver without the use of tools; and (b) a remote transmitter including mannually-actuatable switches corresponding to the television functions to be controlled, signal generator means responsive to the actuation of one of said switches for providing a signal of selected, corresponding frequency, and a second transducer responsive to the signal of selected corresponding frequency for generating an ultrasonic sound of corresponding frequency to be transmitted to said first transducer of said remote adaptor.

2. The remote control apparatus as claimed in claim 1, wherein said remote adaptor includes a housing adapted to be inserted within an opening within the front face of said television receiver, and said coupling means disposed upon the exterior of said housing such that when said remote adaptor is disposed within said opening, said coupling means is not accessible from the exterior of said television receiver.

3. The remote control apparatus as claimed in claim 2, wherein said housing has openings disposed therethrough through which the ultrasonic sounds are transmitted to said first transducer, said openings within said housing being disposed such that when said remote adaptor is disposed within said opening of said television receiver, said openings are disposed to be accessible from the exterior of said television receiver to said ultrasonic sounds.

4. The remote control apparatus as claimed in claim 1, wherein said television receiver includes a housing having a front face with an opening therein, said remote adaptor including a housing adapted to be disposed within said opening, and said coupling means being affixed upon said housing such that when said remote adaptor is disposed within said opening, said coupling means is disposed within the interior of said television housing.

5. The remote control apparatus as claimed in claim 4, wherein said television housing includes a face-plate adapted to be disposed from a first position covering said opening, to a second position permitting access by said remote adaptor to said opening.

6. The remote control apparatus as claimed in claim 1, wherein said signal generator means of said remote transmitter comprises oscillator means for generating a fixed frequency and an encoder circuit responsive to the actuation of a selected one of said switches to divide the fixed frequency by a corresponding factor, dependent upon the actuated switch.

7. The remote control apparatus as claimed in claim 6, wherein said television receiver comprises logic circuitry having an input coupled by said coupling means to the amplifier output of said amplifier means of said remote adaptor, said logic circuitry including a receiver decoder responsive to the amplifier output of selected frequency for providing one of a plurality of television function control signals, dependent upon the selected frequency of the amplifier output.

8. The remote control apparatus as claimed in claim 7, wherein said logic circuitry includes a reference oscillator for providing to said receiver decoder, a clock signal of fixed frequency.

9. The remote control apparatus as claimed in claim 8, wherein the fixed frequency of said reference clock circuit is substantially equal to the frequency of said oscillator of said remote transmitter.

10. In a television receiver, readily adaptable apparatus for providing a remote control of selected functions of said television receiver, said remote control apparatus comprising:

(a) an optional detachable remote adaptor to be readily mounted within said television receiver without the use of tools, for detecting transmitted without the use of tools, for detecting transmitted manifestations indicative of the television functions being controlled and applying corresponding control signals to said television receiver; and (b) a remote transmitter including manually-actuatable switches for generating and transmitting to said remote adaptor, manifestations indicative of the television receiver functions to be controlled.

11. The remote control apparatus as claimed in claim 10, wherein said remote transmitter includes first transducer means for generating sound waves of a frequency corresponding to the television function to be controlled, and said remote adaptor includes second transducer means responsive to the transmitted sound waves for providing corresponding electrical signals.

12. In a television receiver adapted for optionally receiving a remote control unit for controlling selected functions of said television receiver, the combination of:

(a) said television receiver including means which are an integral part of said television receiver for controlling said selected functions of said television receiver;

(b) apparatus for adapting said television receiver for remote control including:

(2) an optional detachable remote adaptor adapted to be readily mounted within said television receiver and including a first transducer responsive to ultrasonic sounds indicative of the television function being controlled, amplifier means for amplifying the output of said transducer and means for adaptively coupling the output of said amplifier means to circuitry of said television receiver without the use of tools, and (2) a remote transmitter including manually-actuatable switches corresponding to the television functions to be controlled, signal generator means responsive to the actuation of one of said switches for providing a signal of selected, corresponding frequency, and a second transducer responsive to the signal of selected corresponding frequency for generating an ultrasonic sound of corresponding frequency to be transmitted to said first transducer of said remote adaptor; and (c) decoder means having first and second inputs, said first input being adapted to be optionally coupled to said coupling means to receive the output of said amplifier means of said remote adaptor and second input means for receiving control signals of said control means within said television receiver, said decoder means decoding either input signal as applied to said first input means or said second input means for controlling the corresponding functions of said television receiver.

13. The remote control apparatus as claimed in claim 12, wherein said remote adaptor includes a housing adapted to be inserted within an opening within the front face of said television receiver, and said coupling means disposed upon the exterior of said housing such that when said remote adaptor is disposed within said opening, said coupling means is not accessible from the exterior of said television receiver.

14. The remote control apparatus as claimed in claim 13, wherein said housing has openings disposed therethrough through which the ultrasonic sounds are transmitted to said first transducer, said openings within said housing being disposed such that when said remote adaptor is disposed within said opening of said television receiver, said openings are disposed to be accessible from the exterior of said television receiver to said ultrasonic sound.

15. The remote control apparatus as claimed in claim 12, wherein said television receiver includes a housing having a front face with an opening therein, said remote adaptor including a housing adapted to be disposed within said opening, and said coupling means being affixed with regard to said housing such that when said remote adaptor is disposed within said opening, said coupling means is disposed within the interior of said television housing.

* * * * *

UNITED STATES PATENT AND TRADEMARK OFFICE
CERTIFICATE OF CORRECTION

PATENT NO. : 4,127,876
DATED : November 28, 1978
INVENTOR(S) : Jack Schwartz

It is certified that error appears in the above-identified patent and that said Letters Patent are hereby corrected as shown below:

Claim 10, column 10, line 14, please delete line as it is a duplication of line 13.

Signed and Sealed this

Twenty-fourth Day of April 1979

[SEAL]

Attest:

RUTH C. MASON
Attesting Officer

DONALD W. BANNER
Commissioner of Patents and Trademarks